United States Patent [19]
Millman

[11] Patent Number: 5,126,596
[45] Date of Patent: Jun. 30, 1992

[54] TRANSMISSION GATE HAVING A PASS TRANSISTOR WITH FEEDBACK

[75] Inventor: Steven D. Millman, Mesa, Ariz.

[73] Assignee: Motorola, Inc., Schaumburg, Ill.

[21] Appl. No.: 670,629

[22] Filed: Mar. 18, 1991

[51] Int. Cl.$^5$ ............................................. H03K 19/00
[52] U.S. Cl. ..................................... 307/451; 307/243
[58] Field of Search .............. 307/443, 451, 475, 243, 307/584–585, 548, 550

[56] References Cited

U.S. PATENT DOCUMENTS

| | | | |
|---|---|---|---|
| 4,577,124 | 3/1986 | Koike | 307/451 |
| 4,595,845 | 6/1986 | Briggs | 307/443 |
| 4,620,117 | 10/1986 | Fang | 307/443 X |
| 4,691,122 | 9/1987 | Schnizlein et al. | 307/279 |
| 4,692,634 | 9/1987 | Fang et al. | 307/272.1 |
| 4,710,649 | 12/1987 | Lewis | 307/451 |
| 4,733,111 | 3/1988 | Fassino et al. | 307/452 |
| 4,829,203 | 5/1989 | Ashmore, Jr. | 307/451 X |
| 4,839,541 | 6/1989 | Gal et al. | 307/443 X |

Primary Examiner—David Hudspeth
Attorney, Agent, or Firm—Bradley J. Botsch

[57] ABSTRACT

A CMOS transmission gate circuit having a pass transistor and a feedback transistor is coupled across a logic gate. The pass transistor is responsive to a control signal for passing a logic signal. The feedback transistor aids the pass transistor in passing a first logic voltage level when the output signal of the logic gate is a second logic voltage level. Further, the speed performance of the CMOS transmission gate circuit is not degraded if the feedback transistor fails.

5 Claims, 2 Drawing Sheets 5,126,596

TRANSMISSION GATE HAVING A PASS TRANSISTOR WITH FEEDBACK

BACKGROUND OF THE INVENTION

This invention relates to transistors, for example, transistors utilized in transmission gates.

Simple pass transistor networks are typically avoided in MOS technologies because of problems that arise due to degraded signal levels. For example, an N-channel MOS transistor will pass a logic zero without degradation, but will pass a logic one only within a threshold of the power supply rail. As a result, after several levels of pass transistors, a logic one may degrade to the point where it may be interpreted as a logic zero. Further, even if only one pass transistor is used, a static current will flow since an N-channel MOS transistor cannot pull a logic one up to the power supply rail. This static current is typically not tolerable in CMOS technology designs since both the N-channel and P-channel MOS transistors in a CMOS logic gate will be conducting current.

A transmission gate avoids the problem of signal degradation by employing both an N-channel and a P-channel MOS transistor to pass a signal whereby the first electrodes of the N-channel and P-channel MOS transistors are coupled to an input and the second electrodes of the N-channel and P-channel MOS transistors are coupled to the output of the transmission gate. Further, the gate electrode of the N-channel MOS transistor is coupled to a logic signal while the gate electrode of the P-channel MOS transistor is coupled to the inversion of the logic signal, as is understood. While the use of transmission gates facilitates the design of CMOS circuits, the testing of such circuits is extremely difficult. For instance, one way to test the transmission gate is to try and pass both a logic zero and a logic one through the transmission gate. While such a test will determine whether there is a failure that affects the entire transmission gate, it may not detect a failure in only one of the N-channel or P-channel MOS transistors. For example, assume that the transmission gate's P-channel MOS transistor has failed in such a way that it cannot be turned on. The transmission gate has therefore been reduced to the case of the simple pass transistor as aforementioned. Thus, the N-channel MOS transistor will pass logic zeros adequately. However, as aforedescribed, the N-channel MOS transistor will suffer timing and voltage degradations when trying to pass logic ones. It is important to note that the defective transmission gate, given sufficient time, will still function normally. Therefore, simple functional tests are unlikely to detect such failures.

One approach that can be used to detect a single transistor failure in transmission gates involves current monitoring so as to try and detect a static current. However, this approach is not practical for two reasons. First, current monitors are typically slower than modern test equipment and therefore testing will have to be slowed down. Second, the static current which results from a faulty transmission gate may not be significant compared to the load current typically drawn by the chip. Hence, the presence of the excess current would not even be detected.

Another approach which can be used to detect single transistor failures in transmission gates involves looking for an extra delay introduced by the failure. However, this approach is not practical for at least two reasons. First, delay tests are difficult to generate for large chips. Second, typically only the longest or sometimes nearly longest delay paths are tested. However, timing degradations caused by faulty transmission gates can be so severe that even normally fast paths become the longest delay path in the circuit. Thus, this normally short path would not be tested.

From the foregoing discussion, it is clear that transmission gates present a critical testing problem wherein under typical test conditions, the faulty chip will continue to function properly since simple functional tests will not detect single transistor failures within the transmission gate. Hence, there exists a need to provide a transmission gate that does not degrade performance when it fails.

SUMMARY OF THE INVENTION

Briefly there is provided a CMOS transmission gate circuit coupled across a logic circuit comprising a first circuit responsive to a control signal for passing an input signal applied at an input of the first circuit to an output of the first circuit, the output of the first circuit being coupled to an input of the logic circuit; and a feedback circuit for aiding the first circuit to pass a logic high voltage level when the voltage level appearing at the output of the logic gate is a logic low voltage level.

It is an advantage of the present invention to provide a transmission gate utilizing a feedback transistor coupled across a logic circuit such that the performance of the transmission gate does not degrade when the feedback transistor fails. It is also an advantage of the present invention to provide a transmission gate which utilizes a feedback transistor coupled across a logic gate such that proper logic voltage levels are developed at an input of the logic gate.

DETAILED DESCRIPTION OF THE INVENTION

Figure 1:
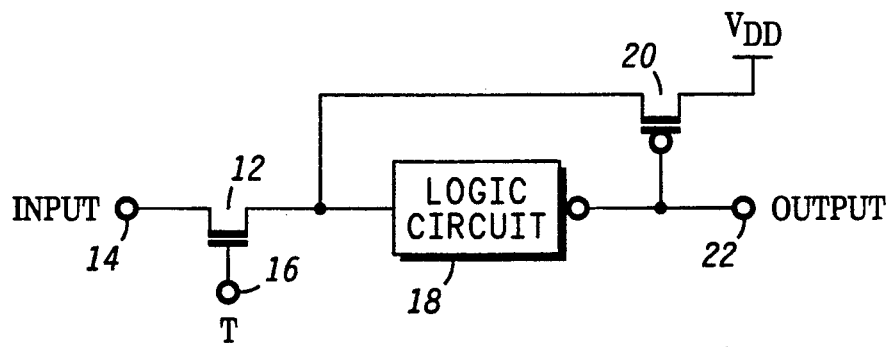
FIG. 1 is a partial schematic/block diagram of a transmission gate utilizing a pass transistor with feedback in accordance with the present invention.

Referring to FIG. 1, a partial schematic/block diagram of a transmission gate utilizing a pass transistor with feedback is shown comprising N-channel MOS transistor 12 having a first electrode coupled to terminal 14 at which signal INPUT is applied. The gate electrode of N-channel MOS transistor 12 is coupled to terminal 16 at which control signal T is applied. The second electrode of N-channel MOS transistor 12 is coupled to the input of logic circuit 18 and to a first electrode of P-channel MOS transistor 20. The output of logic circuit 18 is coupled to terminal 22 for providing signal OUTPUT. Further, the output of logic circuit 18 is coupled to the gate electrode of P-channel MOS transistor 20. The second electrode of P-channel MOS transistor 20 is coupled to a first supply voltage terminal at which the operating potential $V_{DD}$ is applied.

In operation, pass transistor 12 is rendered operative by a logic high signal being applied to terminal 16. If signal INPUT is a logic zero, feedback transistor 20 is rendered non-operative since an inversion of the signal appearing at the input of logic circuit 18 controls feedback transistor 20. Further, pass transistor 12 is able to pass the logic zero to terminal 22 without degradation of the signal, as is understood. However, if signal INPUT is a logic one, feedback transistor 20 is rendered operative thereby helping the output of pass transistor 12 to pull up to power supply rail $V_{DD}$. Thus, it should be realized that feedback transistor 20 has two effects. First, it enables the output of pass transistor 12 to be pulled completely up to the power supply rail ($V_{DD}$) thereby eliminating the static current which would result if the logic one could only be pulled to within a threshold of the power supply rail. The second effect of feedback transistor 20 is that it slows down a logic high to logic low transition of pass transistor 12 and correspondingly speeds up a logic low to logic high transition of pass transistor 12. However, this second effect, which can cause skew, can be compensated for by altering the P:N ratio of the gate circuit which follows pass transistor 12. As an example, raising the threshold voltage of logic circuit 18 would cause logic circuit 18 to switch faster on a logic high to a logic low transition and slower on a logic low to logic high transition thereby eliminating skew.

The novel transmission gate of FIG. 1 is similar in size and yields similar performance to that of a typical transmission gate. However, the novel transmission gate exhibits improved test qualities. For instance, if N-channel MOS transistor 12 fails, this would be analogous to the failure of an entire typical transmission gate. As a result, there will exist a functional failure and it will be detected by a functional test of the circuit. Further, if P-channel MOS transistor 20 fails, there will exist a static current in the gate circuit following pass transistor 12. However, simulated test data results indicate that the novel transmission gate will still function properly and there will be no performance degradation, for example, there will be little effect on the speed of the signal from terminal 14 to terminal 22. In fact, the transmission gate may even operate faster since there may be less loading on the output of pass transistor 12. Thus, single transistor failures in the novel transmission gate will either be detected or will not affect the performance of the overall circuit. On the contrary, single transistor failures in a typical transmission gate will not adequately allow the output of the transmission gate to pull up to the proper logic high voltage level if the P-channel MOS transistor fails, or pull down to the proper logic low voltage level if the N-channel MOS transistor fails, as aforedescribed. Hence, it should be realized that the novel transmission gate possesses improved performance characteristics over the prior art.

It must be realized that logic circuit 18 can be a plurality of logic gates, for example, an inverter, a NAND gate or an XOR gate. The only requirement being that an output signal of logic circuit 18 controls the switching of feedback transistor 20 such that when the signal appearing at the input of logic circuit 18 is at a logic high state and the output of logic circuit 18 is at a logic low state, P-channel MOS transistor 20 is rendered operative and helps pull up the voltage level appearing at the input of logic circuit 18 to power supply rail $V_{DD}$. Further, it is worth noting that an inverter could be used to achieve the feedback instead of feedback transistor 20. However, since pass transistor 12 only requires help to pull up to the power supply rail, feedback is only required through half of the inverter. Thus, area and speed can be saved by only utilizing single feedback P-channel MOS transistor 20. It is also worth noting that P-channel MOS transistor 20 must be weak enough so that the input signal applied to terminal 14 via transistor 12 can outdrive feedback transistor 20 thereby preventing latching.

Figure 2:
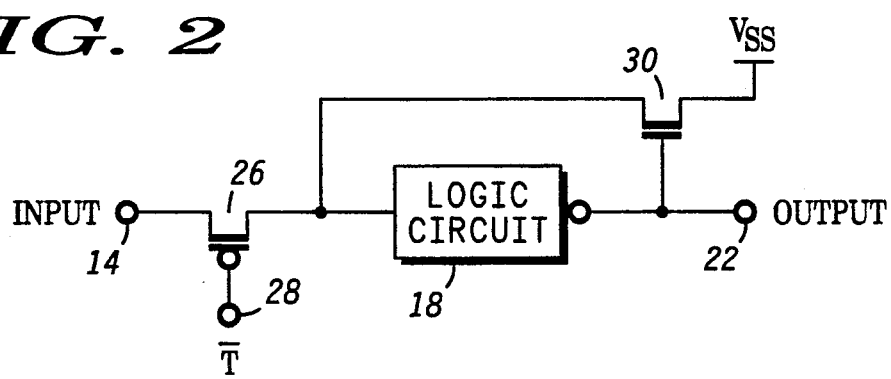
FIG. 2 is a partial schematic/block diagram of a second embodiment of a transmission gate utilizing a pass transistor with feedback in accordance with the present invention.

Referring to FIG. 2, a partial schematic/block diagram of a second embodiment of a transmission gate utilizing a pass transistor with feedback is shown. It is understood that components similar to those of FIG. 1 are referenced by like numerals. The second embodiment shown in FIG. 2 includes P-channel MOS transistor 26 having a first electrode coupled to terminal 14. The gate electrode of P-channel MOS transistor 26 is coupled to terminal 28 at which control signal $\overline{T}$ is applied. The second electrode of P-channel MOS transistor 26 is coupled to the input of logic circuit 18 and to the second electrode of N-channel MOS transistor 30. The output of logic circuit 18 is coupled to the gate electrode of N-channel MOS transistor 30, the latter having a first electrode coupled to a second supply voltage terminal at which the operating potential $V_{SS}$ is applied.

The operation of the second embodiment shown in FIG. 2 is similar to the operation of the transmission gate shown in FIG. 1. It should be noted that pass transistor 12 of FIG. 1 was an N-channel MOS transistor while pass transistor 26 of FIG. 2 is a P-channel MOS transistor. Likewise, feedback transistor 20 of FIG. 1 is a P-channel MOS transistor while feedback transistor 30 of FIG. 2 is an N-channel MOS transistor. Briefly, when pass transistor 26 is rendered operative by a logic low signal being applied to terminal 28, and signal INPUT is a logic one, feedback transistor 30 is rendered non-operative. Further, pass transistor 26 is able to pass the logic one to terminal 22 without degradation of the signal. However, if signal INPUT is a logic zero, feedback transistor 30 is rendered operative thereby helping the output of pass transistor 26 to pull down to power supply rail $V_{SS}$.

Similar to the embodiment of FIG. 1, it must be realized that logic circuit 18 can be a plurality of logic gates, for example, an inverter, a NOR gate or an XOR gate. The only requirement being that an output of logic circuit 18 controls the switching of feedback transistor 30 such that when the signal appearing at the input of logic circuit 18 is at a logic low state and the signal at the output of logic circuit 18 is at a logic high state, N-channel MOS transistor 30 is rendered operative and helps pull down the voltage level appearing at the input of logic circuit 18 to power supply rail $V_{SS}$. Further, N-channel MOS transistor 30 must be weak enough so that the input signal applied to terminal 14 via transistor 26 can outdrive feedback transistor 30 thereby preventing latch up.

Figure 3:
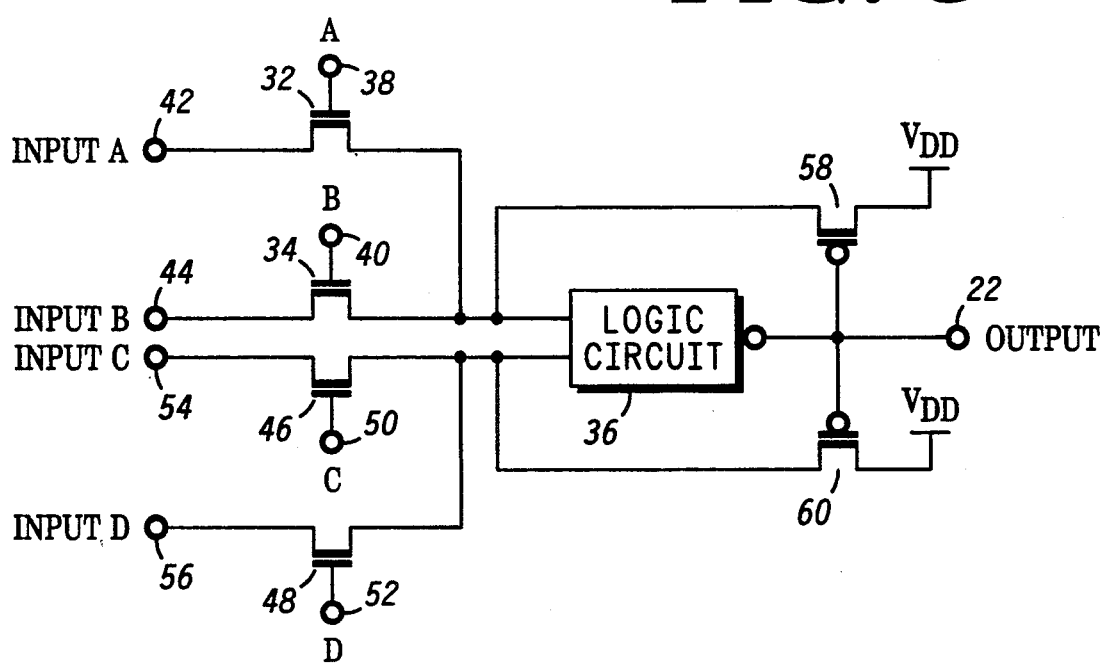
FIG. 3 is a partial schematic/block diagram of a third embodiment of a transmission gate utilizing a pass transistor with feedback in accordance with the present invention.

Referring to FIG. 3, a partial schematic/block diagram of a third embodiment of a transmission gate utilizing a pass transistor with feedback is shown. It is understood that components similar to those shown in FIG. 1 are referenced by like numerals. The third embodiment of FIG. 3 includes N-channel MOS transistors 32 and 34 each having a second electrode coupled to a first input of gate circuit 36. The control electrodes of N-channel MOS transistors 32 and 34 are respectively coupled to terminals 38 and 40 at which control signals A and B are applied, respectively. The first electrodes of N-channel MOS transistors 32 and 34 are respectively coupled to terminals 42 and 44 at which signals INPUTA and INPUTB are applied, respectively. In a similar manner to transistors 32 and 34, transistors 46 and 48 each have a second electrode coupled to the second input of gate circuit 36. The control electrodes of N-channel MOS transistors 46 and 48 are respectively coupled to terminals 50 and 52 at which control signals C and D are applied, respectively. The first electrodes of N-channel MOS transistors 46 and 48 are respectively coupled to terminals 54 and 56 at which signals INPUTC and INPUTD are applied, respectively. P-channel MOS transistors 58 and 60 each have a control electrode coupled to the output of gate circuit 36. The first electrodes of P-channel MOS transistors 58 and 60 are coupled to operating potential $V_{DD}$. The second electrode of P-channel MOS transistor 58 is coupled to the first input of gate circuit 36, while the second electrode of P-channel MOS transistor 60 is coupled to the second input of gate circuit 36. Also, the output of gate circuit 36 is coupled to terminal 22 for providing signal OUTPUT.

The third embodiment shown in FIG. 3 multiplexes signals INPUTA and INPUTB to the first input of gate circuit 36 via pass transistors 32 and 34. Likewise, signals INPUTC and INPUTD are multiplexed to the second input of gate circuit 36 through pass transistors 46 and 48. Furthermore, it should be understood that control signals A and B are typically non-overlapping complementary logic signals. Likewise, control signals C and D are also typically complementary non-overlapping logic signals. As an example, assume that control signals A and C are at a logic one state while control signals B and D are at a logic zero state. Thus, signal INPUTA appears at the first input of gate circuit 36 via pass transistor 32 while signal INPUTC appears at the second input of gate circuit 36 via pass transistor 46. It should now be realized that P-channel MOS transistor 58 functions in a similar manner as did P-channel MOS transistor 20 of FIG. 1 wherein P-channel MOS transistor 58 helps pull up a logic one occurring at the first input of gate circuit 36 to power supply rail $V_{DD}$. Likewise, P-channel MOS transistor 60 also functions in a similar manner to P-channel MOS transistor 20 of FIG. 1 wherein P-channel MOS transistor 60 helps pull up a logic one occurring at the second input of gate circuit 36 to power supply rail $V_{DD}$.

In summary, the circuit shown in FIG. 3 illustrates how the novel transmission gate can be utilized to multiplex signals to the input of a gate circuit. It should be realized that only one feedback transistor is needed for each input of gate circuit 36 regardless of the number of signals being multiplexed at each input of gate circuit 36. Thus, any number of signals can be multiplexed at an input of gate circuit 36 while still utilizing only one feedback transistor. Further, it should be realized that in a different implementation pass transistors 32, 34, 46 and 48 could be P-channel MOS transistors with corresponding feedback transistors 58 and 60 being N-channel MOS transistors.

Figure 4:
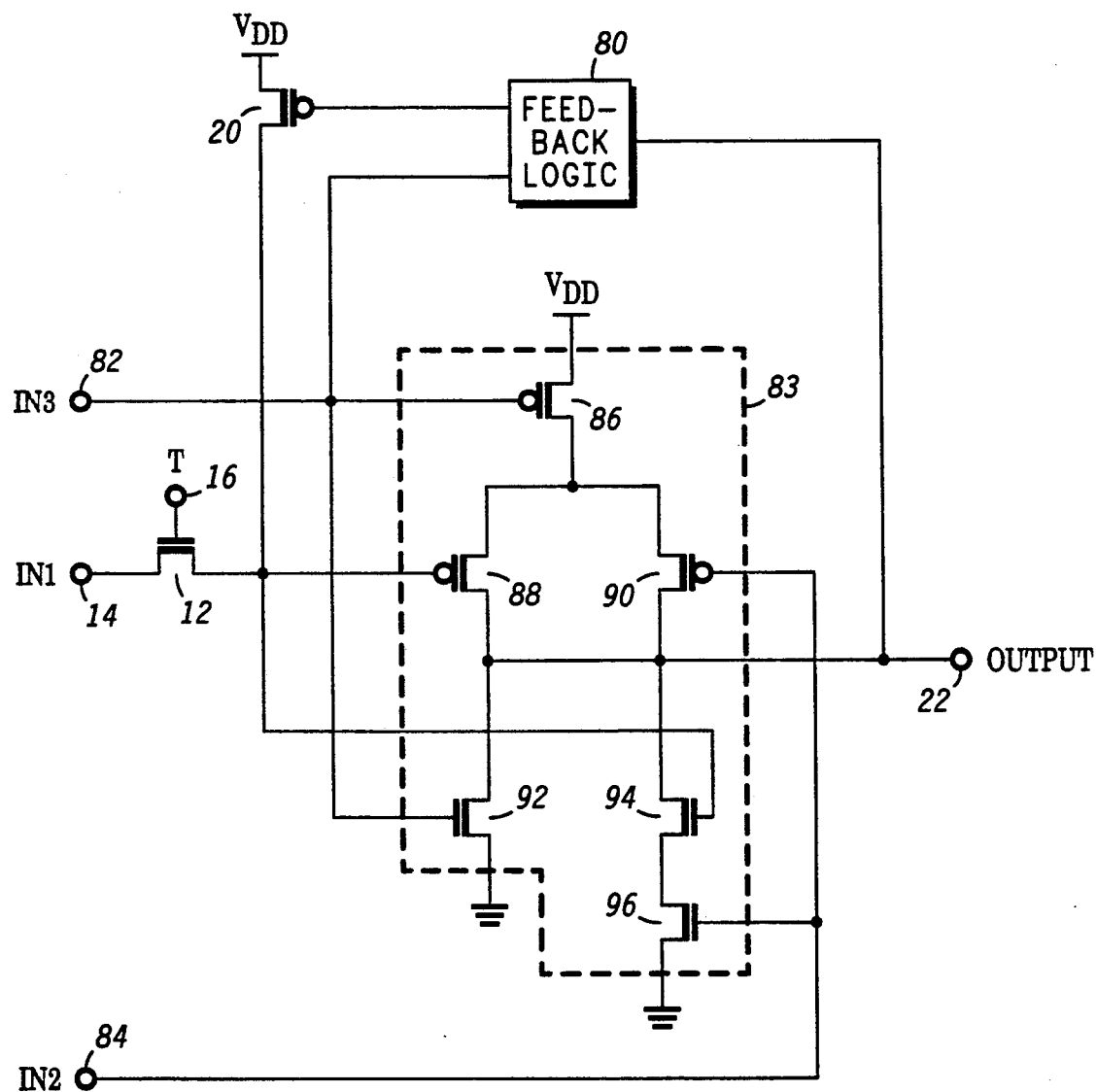
FIG. 4 is a partial schematic/block diagram of a fourth embodiment of a transmission gate utilizing a pass transistor with feedback in accordance with the present invention

Referring to FIG. 4, a partial schematic/block diagram of a fourth embodiment of a transmission gate utilizing a pass transistor with feedback is shown. It is understood that components similar to those of FIG. 1 are referenced by like numbers. The circuit of FIG. 4 further comprises feedback logic circuit 80 having a first input coupled to terminal 22 and a second input coupled to terminal 82 at which input signal IN3 is applied. The output of feedback logic circuit 80 is coupled to the gate electrode of feedback transistor 20. Logic circuit 83 has a first input coupled to the source electrode of pass transistor 12 for receiving input signal IN1. The second and third inputs of logic circuit 83 are respectively coupled to terminals 84 and 82 at which input signals IN2 and IN3 are applied, respectively.

Logic circuit 83 includes PMOS transistor 86 having a source electrode coupled to operating potential $V_{DD}$ and a gate electrode coupled for receiving input signal IN3. The drain electrode of PMOS transistor 86 is coupled to the source electrodes of PMOS transistors 88 and 90. The gate electrode of PMOS transistor 88 is coupled to the source electrode of NMOS transistor 12 while the gate electrode of PMOS transistor 90 is coupled for receiving input signal IN2. The drain electrodes of PMOS transistors 88 and 90 are respectively coupled to the drain electrodes of NMOS transistors 92 and 94 and to the output of logic circuit 83 whereby the output of logic circuit 83 is also coupled to terminal 22. The gate electrode of NMOS transistor 92 is coupled for receiving input signal IN3 while the gate electrode of NMOS transistor 94 is coupled to the source electrode of pass transistor 12 for receiving input signal IN1 via pass transistor 12. The source electrode of NMOS transistor 92 is returned to ground and the source electrode of NMOS transistor 94 is coupled to the drain electrode of NMOS transistor 96. The gate electrode of NMOS transistor 96 is coupled for receiving input signal IN2 while the source electrode of the same is returned to ground.

The circuit in FIG. 4 illustrates how any complex logic circuit can be used in conjunction with pass transistor 12 and feedback transistor 20. Further, it is understood that logic circuit 83 in FIG. 4 is only one example of a logic circuit that can be used. Logic circuit 83 has three input signals: IN1, IN2 and IN3, and provides output signal Z. A truth table for logic circuit 83 is shown below in Table 1.

TABLE 1

| Truth table for logic circuit 83 of FIG. 4. | | | |
|---|---|---|---|
| INPUTS | | | OUTPUT |
| IN1 | IN2 | IN3 | Z |
| 0 | 0 | 0 | 1 |
| 0 | 0 | 1 | 0 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

From the previous discussions concerning FIGS. 1-3, feedback transistor 20 is required to be rendered operative when input signal IN1 is a logic one and when output signal Z is a logic zero thereby helping pull up the logic level appearing at the first input of logic circuit 83 to voltage $V_{DD}$. However, this sole requirement may not be sufficient when the logic circuit becomes more complex, such as logic circuit 83. In fact, after analysis of the truth table for logic circuit 83, it can be concluded that feedback transistor 20 should be rendered operative not only when input signal IN1 is a logic one and output signal Z is a logic zero, but also when input signal IN3 is a logic zero. The additional condition that input signal IN3 be a logic zero is required since if output signal Z is a logic zero and input signal IN3 is a logic zero, then input signal IN1 must be a logic one, as illustrated in the fifth row of table 1. Further, through the use of Karnaugh maps, feedback logic circuit 80 is found to be a 2-input OR gate having a first input coupled to the output of logic circuit 83, a second output coupled for receiving input signal IN3 and an output coupled to the gate electrode of feedback transistor 20.

It is worth noting that for the circuit shown in FIG. 4, feedback logic circuit 80 could be replaced by a P-channel MOS transistor which is placed in series with pass transistor 20 wherein the gate electrode of the P-channel transistor would be coupled for receiving input signal IN3.

In summary, by utilizing feedback logic circuit 80 to control the operation of feedback transistor 20, it should be realized that any type of logic circuit can be used in conjunction with the novel pass transistor with feedback transmission gate.

By now it should be apparent from the foregoing discussion that a novel transmission gate having a pass transistor with feedback has been provided that does not degrade performance when it fails.

I claim:

1. A CMOS circuit including a CMOS transmission gate, comprising:
   first circuit means responsive to a control signal for passing a signal to an output of said first circuit means;
   first logic means having a plurality of inputs for receiving a plurality of logic signals and having an output, a first one of said plurality of inputs of said first logic means being coupled to said output of said first circuit means; and
   feedback circuit means coupled to said output of said first logic means and responsive to at least one of said plurality of logic signals for aiding said first circuit means in passing a first logic voltage level.

2. The CMOS circuit according to claim 1 wherein said feedback circuit means includes:
   second logic means having a plurality of inputs and an output, said plurality of inputs of said second logic means being coupled to receive at least one of said plurality of logic signals and wherein one of said plurality of inputs of said second logic means is coupled to said output of said first logic means; and
   a transistor having first, second and control electrodes, said control electrode being coupled to said output of said second logic means, said second electrode being coupled to a first supply voltage terminal, and said first electrode being coupled to one of said plurality of inputs of said first logic means.

3. The CMOS circuit according to claim 2 wherein said first circuit means includes a transistor having first, second and control electrodes, said first electrode of said transistor of said first circuit means being coupled to receive said signal, said second electrode of said transistor of said first circuit means being coupled to said first one of said plurality of inputs of said first logic means, and said control electrode of said transistor of said first circuit means being coupled to receive said control signal.

4. A CMOS circuit, comprising:
   a logic circuit having a plurality of inputs and an output;
   a plurality of pass transistors each having first, second and control electrodes, said first electrodes of each of said plurality of pass transistors being respectively coupled to receive a plurality of input signals, said second electrodes of each of said plurality of pass transistors being respectively coupled to said plurality of inputs of said logic circuit, and said control electrodes of each of said plurality of pass transistors being respectively coupled to receive a plurality of control signals;
   a first feedback transistor having first, second and control electrodes, said first electrode of said first feedback transistor being coupled to a first supply voltage terminal, said second electrode of said first feedback transistor being coupled to a first one of said plurality of inputs of said logic circuit, and said control electrode of said first feedback transistor being coupled to said output of said logic circuit; and
   a second feedback transistor having first, second and control electrodes, said first electrode of said second feedback transistor being coupled to said first supply voltage terminal, said second electrode of said second feedback transistor being coupled to a second one of said plurality of inputs of said logic circuit, and said control electrode of said second feedback transistor being coupled to said output of said logic circuit.

5. The CMOS circuit according to claim 4 wherein said plurality of pass transistors are N-type MOS transistors and said first and second feedback transistors are P-type MOS transistors.

* * * * *